United States Patent [19]

Kato

[11] Patent Number: 4,553,130
[45] Date of Patent: Nov. 12, 1985

[54] VARIABLE-LENGTH ENCODING-DECODING SYSTEM

[75] Inventor: Masaaki Kato, Kawasaki, Japan

[73] Assignee: Tokyo Shibaura Denki Kabushiki Kaisha, Kawasaki, Japan

[21] Appl. No.: 586,743

[22] Filed: Mar. 6, 1984

[30] Foreign Application Priority Data

Mar. 11, 1983 [JP] Japan .................................. 58-40372

[51] Int. Cl.$^4$ ................................................ G11B 5/09
[52] U.S. Cl. ............................................. 340/347 DD
[58] Field of Search .................................. 340/347 DD

[56] References Cited

U.S. PATENT DOCUMENTS

| 3,689,899 | 9/1972 | Franaszek . | |
| 4,032,979 | 6/1977 | Rice ............................. | 340/347 DD |
| 4,115,768 | 9/1978 | Eggenberger et al. ..... | 340/347 DD |
| 4,232,388 | 11/1980 | Isailovic ....................... | 340/347 DD |

FOREIGN PATENT DOCUMENTS 2508706  11/1975  Fed. Rep. of Germany .

OTHER PUBLICATIONS

Patent Abstracts of Japan, vol. 7, No. 23, Jan. 29, 1983 and JP-A-57-176519.
Patent Abstracts of Japan, vol. 6, No. 147, Aug. 6, 1982 and JP-A-57-69959.
Franaszek, "IBM Technical Disclosure Bulletin", vol. 23, No. 11, Apr. 1981, pp. 5229-5232.

Primary Examiner—William M. Shoop, Jr.
Assistant Examiner—Sharon D. Logan
Attorney, Agent, or Firm—Oblon, Fisher, Spivak, McClelland & Maier

[57] ABSTRACT

A variable-length encoding device includes a shift register for converting a binary data string representing an audio signal into unit words of three 2-bit data (e.g., (1,1), (1,0), and (0,1) and two 3-bit data (e.g., (0,0,0) and (0,0,1). The 3-bit data words are obtained such that the remaining 2-bit data (i.e., (0,0)) is used as upper two bits of each of the resultant 3-bit data and is combined with each of the "1" and "0" data of the resultant 3-bit data. The output data words from the shift register are converted by a logic circuit to the corresponding code words in one-to-one correspondence. Each code word has a bit number twice that of the input data word. If a bit array (1,0,1) is included in the code word bit stream thus obtained, this bit array is further converted to (0,0,1).

9 Claims, 7 Drawing Figures

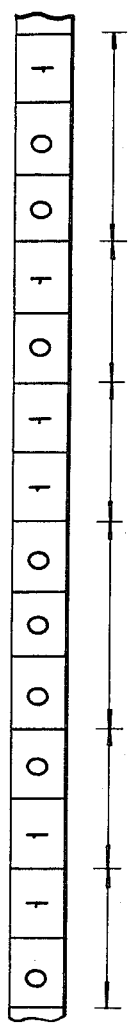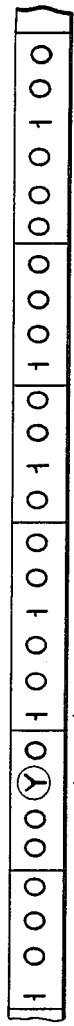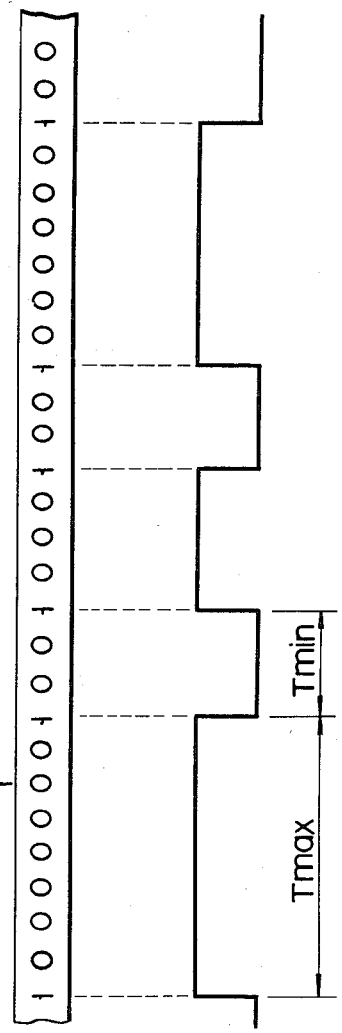
F I G. 3A  F I G. 3B  F I G. 3C  F I G. 3D

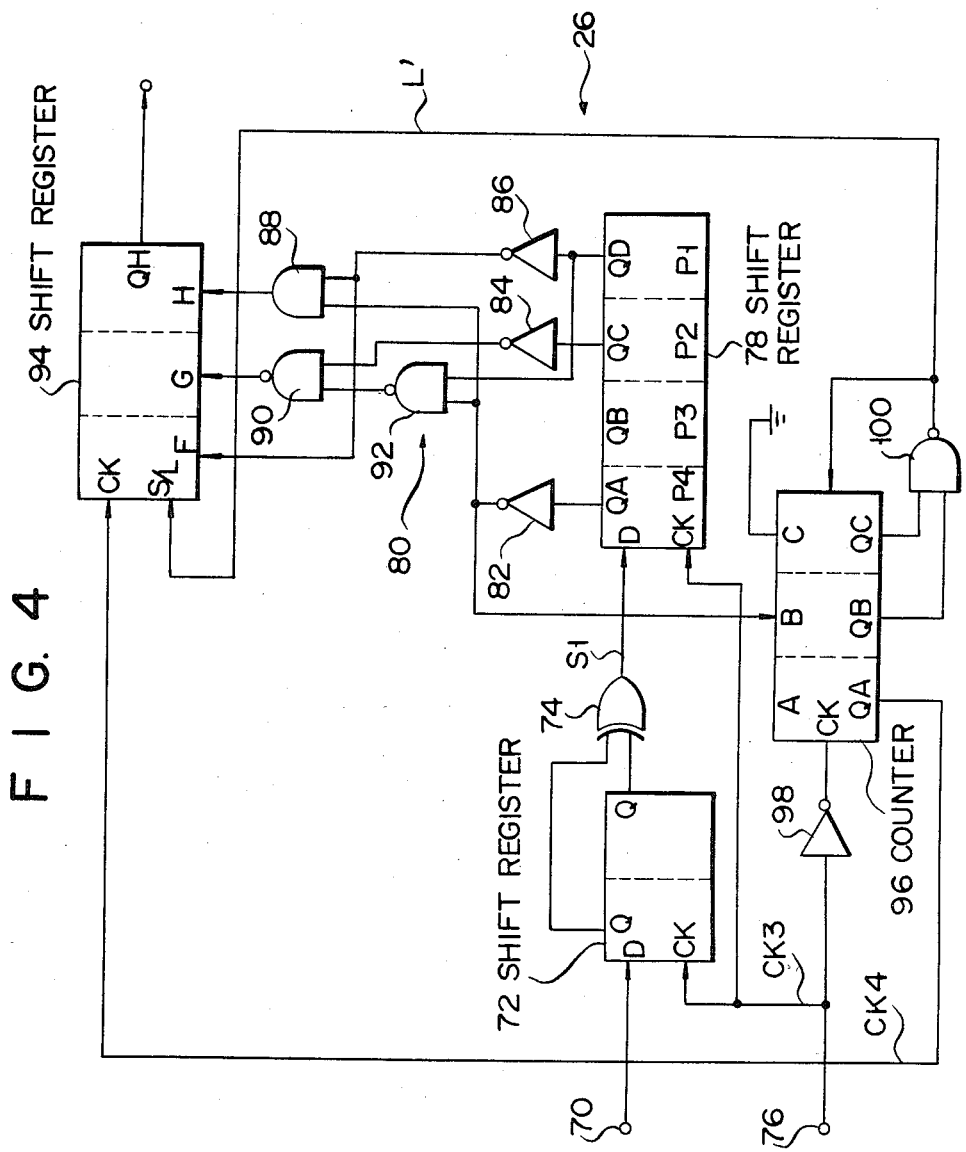
F I G. 4

VARIABLE-LENGTH ENCODING-DECODING SYSTEM

BACKGROUND OF THE INVENTION

The present invention relates in general to a variable-length encoding-decoding system and, in more particular, to a variable-length encoding-decoding system applied to enhance the efficiency of recording/reproduction of digital information on a recording medium.

When binary digital data stream such as digital audio information is recorded on a predetermined recording medium such as a magnetic tape, binary data is modulated or encoded for recording so as to increase a recording density of the recording medium. The 3 position modulation (called 3PM) technique is known as one of the encoding techniques. According to this modulation technique, binary data stream is framed in units of three bits. The 3-bit data word is converted into a 6-bit encoded word (code word). A recording signal is subjected to transition so as to correspond to binary data of logic "1" among logic levels "1" and 37 0" contained in the encoded word. The recording signal obtained in accordance with the 3PM technique has a pulse waveform which changes between two predetermined levels. According to this modulation technique, at least two "0"s are present between adjacent logic "1"s in a succession of code words. When the logic "1" data are subjected to transition and are recorded on the recording medium, the number of times of transition can be decreased as compared with the case where the original binary data stream is recorded thereon. This fact contributes to an increase in data recording density.

When transition is performed in synchronism with the logic "1" data included in the succession of code words, it is required that a minimum distance of the transitions (i.e., minimum transition period) (Tmin) of signal polarities is longest and, at the same time, a maximum distance of transitions (i.e., maximum transition period) (Tmax) is shortest. Under the condition that the recording signal is subjected to transition in accordance with the succession of code words, the longer the minimum transition period (Tmin) (i.e., the minimum time for two successive transitions of the signal levels to occur) becomes, the higher the data recording density of the recording medium becomes. However, in the case where the maximum transition period is long, it is difficult to extract the clock signals in the reproduction mode of the recorded signal. In addition to this drawback, the necessary configuration of the system becomes complex. In other words, it is easy to extract the clock signal from the recorded signal when the maximum transition period Tmax is shortest. From this point of view, when the bit cell period of the data word is given to be T, the minimum transition period Tmin becomes 1.5 T and the maximum transition period Tmax becomes 6T in the 3PM technique. Therefore, when the data stream is encoded by the above-mentioned modulating method to record the encoded data on the recording medium, extraction of the clock signal cannot be easily carried out, resulting in inconvenience.

The above problem is overcome by a variable-length encoding-decoding technique disclosed in U.S. Pat. No. 3,689,899. According to this technique, the data stream is encoded such that a ratio of the number of data words to the number of code words is fixed between 1:2 while the block length of the data word varies between 2 bits, 3 bits and 4 bits. According to the teaching of this U.S. Patent, the maximum transition period Tmax can be improved to be up to 4T. However, this encoding-decoding system requires an associative memory and becomes bulky. The circuit arrangement of this system becomes complex, which entails another problem. Although the encoding-decoding efficiency can be improved, the circuit configuration of the system becomes complex. As a result, it is not expected that this system will be applicable to a digital audio recording/reproduction system such as a digital audio tape recorder which uses a magnetic tape that has been recently developed.

In addition to the technique disclosed in the above-mentioned U.S. Patent, the encoding-decoding techniques which resemble the 3PM technique are disclosed in Japanese Patent Disclosure (KOKAI) Nos. 54-80726, 56-101614, 57-69959 and so on. These conventional encoding-decoding systems cannot simultaneously satisfy the requirements of encoding-decoding efficiency and a simple circuit arrangement.

SUMMARY OF THE INVENTION

It is an object of the present invention to provide a new and improved variable-length encoding-decoding technique which requires only a simple circuit arrangement and which is capable of effectively setting maximum and minimum transition periods when a signal to be recorded is modulated or encoded.

According to the present invention, a bit data stream which represents audio signal information or the like is modulated or encoded when it is recorded on a predetermined recording medium. The bit data stream is framed into five types of variable-length data words. These data words consist of three 2-bit data words (e.g., (0,1), (1,0) and (1,1)) preselected from four 2-bit data arrays ((0,0), (0,1), (1,0) and (1,1)) and of two 3-bit data words (e.g., (0,0,0) and (0,0,1)) obtained by combining the remaining one 2-bit data array (e.g., (0,0)) as the upper two bits and two 1-bit data (i.e., "0" and "1") as the lower bits of the two 3-bit data arrays (0,0,0) and (0,0,1), respectively. Each 2-bit data word is converted to a 4-bit code word, and each 3-bit data word is converted to a 6-bit code word by the logic circuits. The conversion between the data words and the code words is performed by one-to-one correspondence in accordance with a predetermined convertsion rule. In addition, when a data array (1,0,1) is included in the bit data stream of the code words obtained in the manner described above, this array is converted to (0,0,1). A recording signal having a waveform which is subjected to alternate transition between the first and second signal levels in synchronism with every logic "1" position in the bit data stream thereof is produced and recorded on the recording medium in accordance with the code words obtaind by the above-mentioned simple encoding technique. When the signal recorded on the recording medium is reproduced, the code words are converted to corresponding data words in accordance with the conversion rule described above. In other words, data demodulation or decoding is performed.

BRIEF DESCRIPTION OF THE DRAWINGS

The present invention is best understood by reference to the accompanying drawings, in which:

FIGS. 3A to 3C, respectively, are diagrams illustrating data streams or strings in the main process of the encoding technique according to the present invention;

FIGS. 3D is a diagram showing a waveform of a recording signal synchronous with the succession of code words shown in FIG. 3C; and FIG. 4 is a circuit diagram showing the configuration of a decoder in the system of FIG. 1.

DETAILED DESCRIPTION OF THE PREFERRED EMBODIMENT

Figure 1:
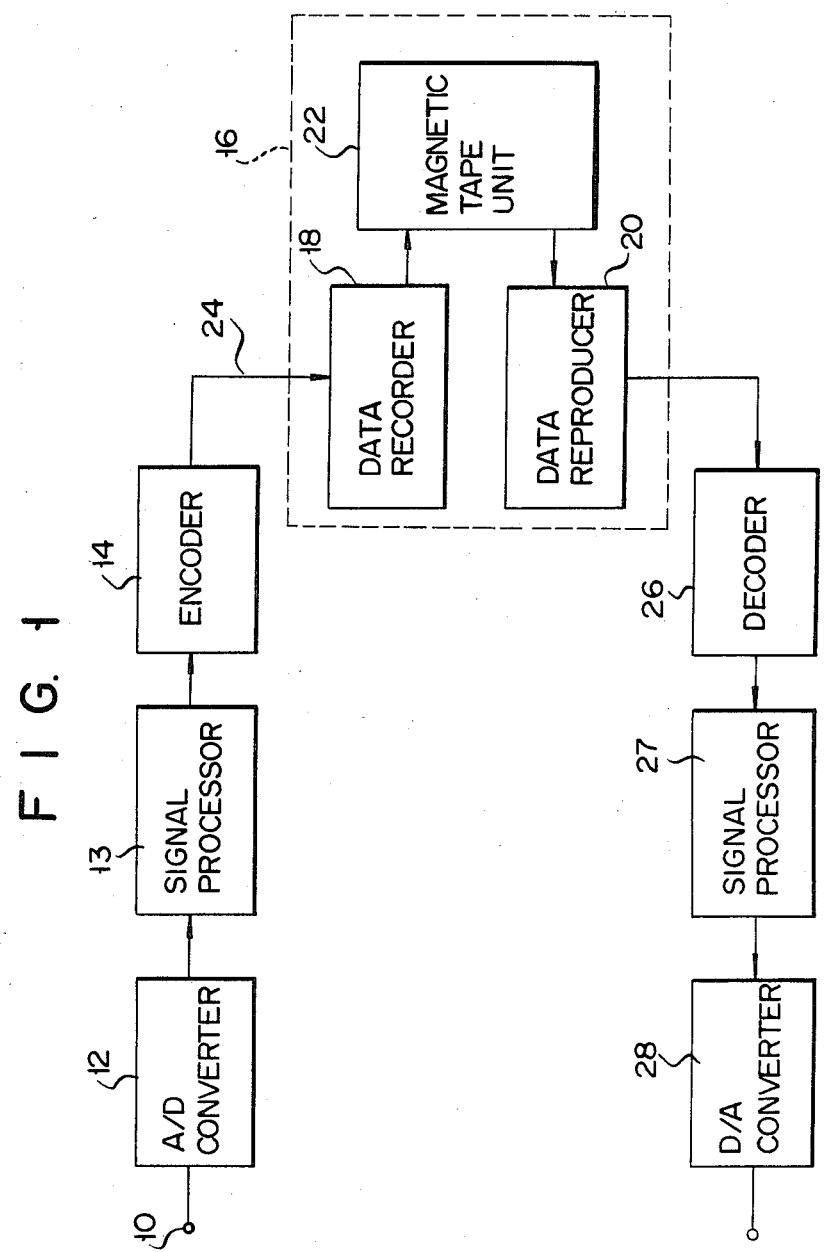
FIG. 1 is a block diagram showing a digital audio recording/reproduction system to which an encoding-decoding technique according to an embodiment of the present invention is applied.

FIG. 1 schematically illustrates a digital audio recording/reproduction system according to an embodiment of the present invention. Reference numeral 10 denotes an input terminal which receives an analog information signal such as an audio signal in a known manner. The input terminal 10 is connected to a modulation section or encoder 14 through a known analog/digital (A/D) converter 12 and a signal processor 13. The signal processor 13 functions to interleave a digital audio signal (i.e., binary data stream) output from the A/D converter 12 and then add an error detection and correction code to the digital audio signal so as to prevent the generation of burst error in the magnetic recording system. The encoder 14 encodes the binary data stream in accordance with the special modulation method to be described later. An output from the encoder 14 is supplied to a recording/reproducing encoder section 16. The section 16 has a data recorder 18, a data reproducer 20 and a magnetic recording medium 22 such as magnetic tape. The data recorder 18 receives a succession of data words generated from the encoder 14 and sequentially detects logic "1" data from the succession of encoded data. Every time the data recorder 18 detects logic "1" data, it converts the signal level of the recording signal into a pulse, thereby producing an encoded recording signal 24. The recording signal 24 is recorded on the magnetic recording medium 22.

In the reproduction mode, the audio data recorded on the magnetic recording medium or magnetic tape 22 is reproduced by the data reproducer 20, and the reproduced signal is supplied to a decoder 26. The reproduced data from the decoder 26 is decoded (demodulated) to the original data. The decoded digital audio signal contains the error detection and correction code which was added thereto in the transitioning mode. When the digital audio signal is supplied to a signal processor 27, error data included in the reproduced digital audio data are concealed and corrected using the error detection and correction code. The signal processor 27 serves to de-interleave the digital audio data interleaved by the aforementioned signal processor 13, there obtaining original binary digital audio data. This data is D/A converted by a digital-to-analog (D/A) converter 28 to an analog audio signal.

The encoding process in the encoder 14 will now be described with reference to FIGS. 3A to 3D. The binary digital data stream supplied to the encoder 14 is framed into 2-bit data words (first data words) and 3-bit data words (second data words) (FIG. 3A). The data included in the stream are represented by logic "1" and logic "0" as follows. The 2-bit data words can comprise a combination of four data arrays (1,1), (1,0), (0,1) and (0,0). A combination of three data arrays e.g., (1,1), (1,0) and (0,1) is selected as the first data words. The nonselected 2-bit data array (in this case (0,0)) is used to produce the second data words (3-bit data words). The 2-bit data array (0,0) is used as the upper bits of each of the 3-bit data. The "0" and "1" logic data are respectively combined as the lower bits of the resultant 3-bit data. In other words, the two 3-bit data arrays (0,0,0) and (0,0,1) are obtained. The binary digital data stream supplied to the encoder 14 is framed in accordance with any one of the 2-bit data words (1,1), (1,0) and (0,1) or any one of the 3-bit data words (0,0,0) and (0,0,1), The resultant data stream is illustrated in FIG. 3A.

The encoder 14 converts each of the data words framed in the manner described above. The 2-bit data words (1,1), (1,0) and (0,1) are converted to code words (1,0,0,0), (0,1,0,0) and 0,0,1,0), respectively. Similarly, the 3-bit data words (0,0,1) and (0,0,0) are converted to code words (1,0,0,1,0,0) and (0,0,0,1,0,0), respectively. It should be noted that the correspondence between the data words and the code words is not limited to the above-mentioned case but can be arbitrarily selected to satisfy one-to-one correspondence.

If the specific encoded word (1,0,1) is detected to be included in the succession of new code words obtained as described above, the encoder 14 converts the specific code word (1,0,1) to another code word (0,0,1). The finally encoded data string thus obtained is supplied to data recorder 18 of the recording/reproducing section 16. It should be noted tht the specific word (1,0,1) is included in the new succession of encoded words when the MSB (i.e., most significant bit) of the code word next to the word (0,0,1,0) is set to be logic "1". In other words, the specific code word (1,0,1) is generated when the code word next to the code word (0,0,1,0) is given to be (1,0,0,0) or (1,0,0,1,0,0). This indicates that the 3rd bit "1" of the encoded word (0,0,1,0) must be inverted in accordance with the MSB value of the next code word. According to the above assumption, when the code word (0,0,1,0) is represented by (0,0,Y,0) (FIG. 3B) the one-to-one correspondence between the data words (a total of 5) obtained by framing the binary data stream and the code words are explicitly given as in the following Table.

TABLE

| Data word | | | | Code word | | | | | |
|---|---|---|---|---|---|---|---|---|---|
| A1 | A2 | A3 | | P1 | P2 | P3 | P4 | P5 | P6 |
| 1 | 1 | — | → | 0 | 1 | 0 | 0 | — | — |
| 1 | 0 | — | → | 0 | 0 | Y | 0 | — | — |
| 0 | 1 | — | → | 1 | 0 | 0 | 0 | — | — |
| 0 | 0 | 1 | → | 0 | 0 | 0 | 1 | 0 | 0 |
| 0 | 0 | 0 | → | 1 | 0 | 0 | 1 | 0 | 0 | wherein the variable bit value given by "Y" is given as follows:

(1) Y=0 when the MSB of the next code word is set to be "1"

(2) Y=1 when the MSB of the next code word is set to be "0".

The data word whose variable bit value is adjusted is illustrated in FIG. 3C.

Figure 2:
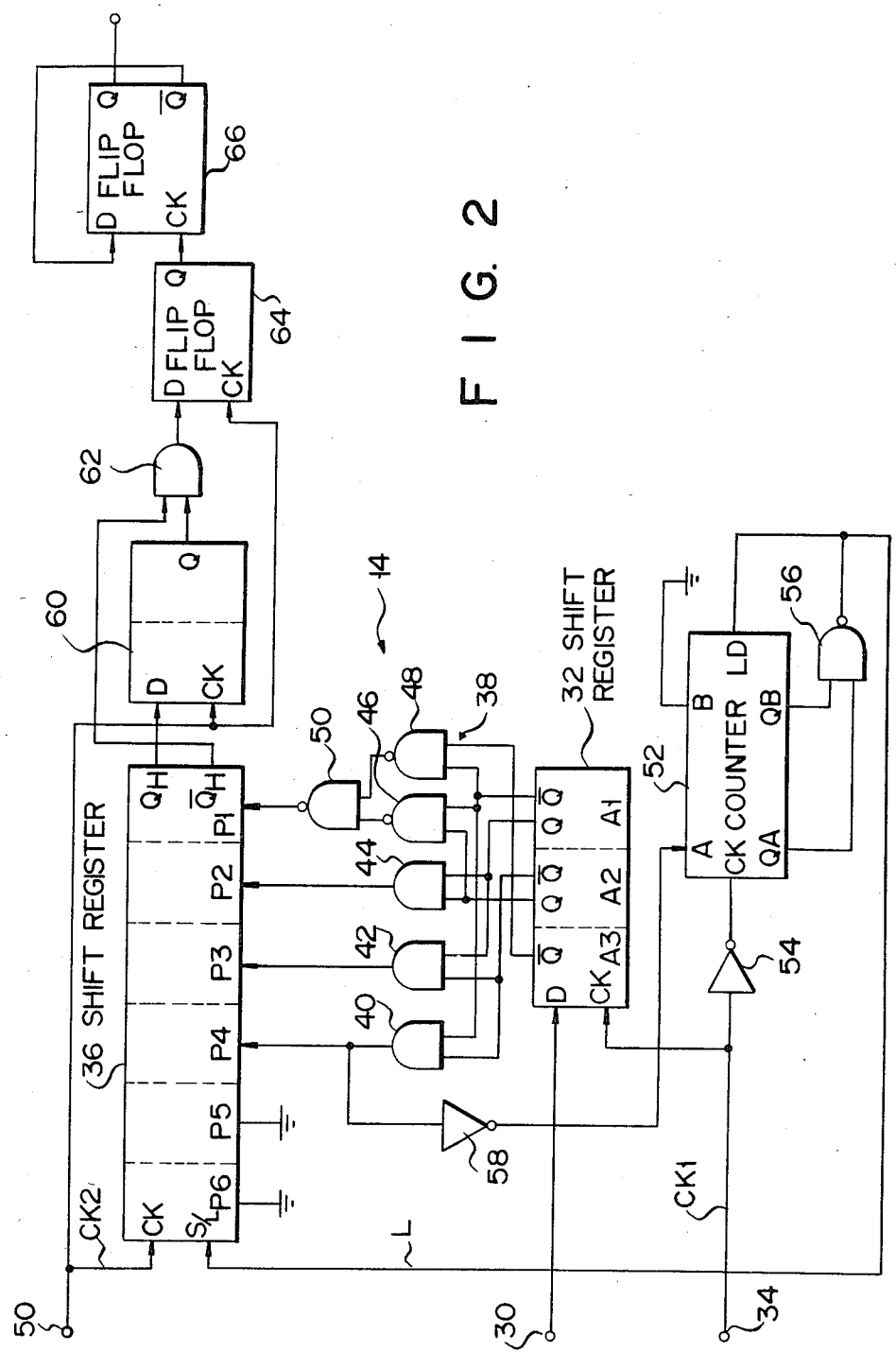
FIG. 2 is a circuit diagram showing an encoder of the system shown in FIG. 1.

The encoder 14 for performing special encoding as described above has the configuration shown in FIG. 2. The audio data stream is supplied through a data input terminal 30 to a shift register 32 whose three stages correspond to the same number as the maximum bit number of the data word. The shift register 32 is operated in accordance with a clock signal CK1 of frequency fO which is supplied to a clock input terminal CK thereof through a terminal 34. Output terminals of the shift register 32 are connected to a parallel-input type shift register 36 through a logic cicuit 38 which comprises AND gates 40, 42 and 44 and NAND gates 46, 48 and 50, as shown in FIG. 2. The logic circuit 38 performs the following parallel logic operation for the bit data A1, A2 and A3 which are set to the shift register 32.

$$P1 = \overline{A1} \cdot A3 + \overline{A1} \cdot \overline{A3}$$

$$P2 = A1 \cdot A2$$

$$P3 = A1 \cdot \overline{A2}$$

$$P4 = \overline{A1} \cdot \overline{A2} \tag{1}$$

The bit data P1 to P4 correspond to the first to fourth bits of the converted code word, respectively. It should be noted that the logic circuit 38 performs the logic operation such that the variable bit value "Y" is normally set to be "1".

The parallel-input type shift register 36 shifts data in response to a clock signal CK of frequency 2fO supplied from a clock terminal 50 to the clock input terminal CK thereof. The shift register 36 serves to receive a load signal L at an input terminal S/L thereof and simultaneously receive binary data P1, P2, P3 and P4 from the logic circuit 38 and binary data P5 and P6 which are normally set to be logic "0" in response to the load signal L. The load signal L is generated by a counter 52 for receiving the clock signal CK1 through an inverter 54 and an NAND gate 56 for gating an output from the counter 52. The counter 52 receives an output signal (i.e., binary data P4) from the AND gate 40 in the logic circuit 38 through an inverter 58, and the binary/ternary counting is switched in response to the data P4. More specifically, when the data P4 is set to be logic "0", the counter 52 serves as a binary counter. However, when the data P4 is set to be logic "1", the counter 52 serves as a ternary counter. When the upper two bits of the data set in the shift register 32 have any one of the combinations (1,1) (1,0) and (0,1), the counter 52 serves as the binary counter to generate the load signal L. In this case, the binary data P1, P2, ..., P6 are loaded in the parallel-input type shift register 36. When the upper two bits are set to be (0,0), the counter 52 serves as the ternary counter. In this case, the obtained binary data P1, P2, ..., P6 are similarly loaded in the shift register 36. Therefore, the input binary data stream is framed in units of 2-bit data words or 3-bit data words. The data words framed in this manner are converted by the logic circuit 38 to the code words in one-to-one correspondence as shown in the above table, and the code words are stored in the shift register 36. Data supplied to the shift register 36 are shifted during a time interval excluding the duration of the load signal L, in response to the clock signal CK2. Therefore, when the 2-bit data word is supplied to the shift register 32, the corresponding code word is shifted by four bits by the parallel-input type shift register 36. On the other hand, when the 3-bit data word is supplied to the shift register 32, the corresponding code word is shifted by 6 bits by the shift register 36.

The output data from the shift register 36 is delayed by a shift register 60 in response to the clock signal CK2 and is supplied to an AND gate 62. The output data fom the shift register 60 and the current output data from the parallel-input type shift register 36 are logically ANDed by the AND gate 62. When the output data word from the shift register 36 is given to be (1,0,1), the output data word (1,0,1) is converted to the data word (0,0,1). In other words, the logic "1" data represented by the variable data value Y in the code word (0,0,Y,0) can be inverted to be logic "0" in accordance with the first bit (MSB) of the next code word (i.e., when the first bit is set to be logic "1") of the code word (0,0,Y,0). When the first bit or MSB of the next code word is set to be "0", the variable data value Y is left unchanged at logic "1". As a result, the proper code words in accordance with the conversion correspondence shown in the table are sequentially produced. These code words are sequentially set in a flip-flop 64. An output from the flip-flop 64 is supplied to a clock input terminal CK of a D flip-flop 66, so that the level of the recording signal can be inverted every time the digital signal of level "1" is generated. Therefore, the recording signal shown in FIG. 3D is prepared. The output data from the D flip-flop 66 is supplied as the demodulated recording signal to the recording/reproducing section 16 of FIG. 1.

According to the encoding technique described above, the minimum number of consecutive "0"s in the succession of the code words is normally 2, as is apparent from the Table. The first bit of the code word (0,1,0,0) is set to the logic "0". The immediately preceding code word has the LSB of logic "0", so the number of "0"s will not be one. When the minimum number of consecutive "0"s is set to be 2, the minimum transition period Tmin of the recording signal is set to be 1.5T, where T represents the period of the bit cell of the data word. On the other hand, the maximum number of consecutive "0"s is given when the code word (0,0,Y,0) follows the code word (1,0,0,0) and the subsequent code word has the first bit of logic "1" under the assumption that the variable bit value Y is set to be logic "0". In this case, the maximum number of consecutive "0"s is 7. This fact indicates that the maximum distance of the transitions (maximum transition period) Tmax is decreased to 4T. Therefore, the minimum distances of the transitions (minimum transition period) Tmin becomes 1.5T which is the same as that in the 3PM technique, and the maximum transition period Tmax becomes 4T which is shorter than 6t of the 3PM technique. Every time a bit of logic "1" is detected, the logic level is inverted to record information, thereby sufficiently increasing the recording density. Since the maximum transition period is as short as 4T, the clock signal can be easily extracted from the recording signal in the reproduction mode. In addition, according to this embodiment, the encoding technique is simple and an associated circuit can be simply constituted by a logic circuit and a register whose stages correspond to the number of bits of the code word to be processed by this system, as shown in FIG. 2. When the present invention is applied to a stationary head digital audio recording-/reproduction system wherein a plurality of tracks are formed on a single magnetic tape and a plurality of encoding-decoding processors are used, the simple arrangement of the circuit greatly contributes to the simple configuration of the system.

Furthermore, in the encoded data stream obtained by the special encoding technique of the present invention and illustrated in the table, when the fourth bit P4 of each code word is checked, the code word can be detected to be a 2 or 3-bit code word. When the fourth bit of the code word is "0", this code word word is the 2-bit code word. However, when the fourth bit P4 is "1", this code word is the 3-bit code word. Therefore, the fourth bit data P4 of each code word can be used as a marker bit. The decoding process of the coded data can be simply performed as described below.

FIG. 4 is a circuit diagram showing the internal configuration of the decoder as in FIG. 1. The maximum transition period Tmax of the digital audio data modulated in the manner described above and recorded on the magnetic recording medium 22 (e.g., magnetic tape ) is as short as 4T. In the reproduction mode, the clock signal component can be easily extracted from the recorded signal, so that the circuit required for decoding can be simple. The decoding or demodulation process of the recorded data will be described below.

The reproduced digital data from the data reproducer 20 is supplied to a two-stage shift register 72 through an input terminal 70 (FIG. 4) of the decoder 26. Outputs from the first and second stages of the shift register 72 are subjected to logic operation by means of an exclusive OR gate 74. As a result, the inverted digital audio data is converted or restored to the succession of code words. The succession S1 of the code words is supplied to a four-stage shift register 78 in response to a clock signal CK3 extracted from the recorded signal and supplied to a clock input terminal 76 of the decoder 26. The shift register 78 generates parallel code data P1, P2, P3 and P4. These parallel data P1 to P4 are supplied to a logic circuit 80 which comprises inverters 82, 84 and 86, an AND gate 88, and NAND gates 90 and 92 in the arrangement shown in FIG. 4. The logic circuit 80 performs the following logic operation:

$$A1 = \overline{P1} \cdot \overline{P4}$$

$$A2 = P2 + P1 \cdot \overline{P4}$$

$$A3 = \overline{P1} \tag{2}$$

The data A1, A2 and A3 are simultaneously supplied to a parallel-input type shift register 94. The loading and shift operations of the shift register 94 are properly controlled by a counter 96. The counter 96 receives an extracted clock signal CK3 through an inverter 98 and frequency-divides the clock signal CK3 into halves, thereby producing a clock signal CK4 of frequency fO, which is supplied as a shifting clock signal to the three-stage shift register 94. The data P4 from the four-stage shift register 78 is supplied to the second-stage component of the counter 96 through the inverter 82. The quaternary/senary counting of the counter 96 is switched in response to the data P4. Second and third output terminals QB and QC of the counter 96 are connected to a NAND gate 100. The output signal from the NAND gate 100 is supplied as a load command signal L' to the three-stage shift register 94. It is easily checked in accordance with the fourth bit data P4 as a masker bit of each code word whether the reproduced digital audio data is 2 or 3-bit data. The code data word whose bit length is detected is loaded and stored in the shift register 94. When the code data is detected to be 2-bit data, only the upper two bits of the bit data A1, A2 and A3 from the logic circuit 80 are supplied to the shift register 94. However, when the code data is detected to be 3-bit data, all the bit data of the data A1, A2 and A3 are supplied to the shift register 94. The succession of data words that can be reproduced in the manner described above. According to this decoding technique, the fourth bit of the code word serves as a marker bit to effectively, simply reproduce the data word string from the code word string.

According ot the present invention described above, the binary data stream can be easily encoded/decoded to obtain code word strings whose minimum number of consecutive "0"s is 2 and whose maximum number of consecutive "0"s is 7, as shown in FIG. 3. Therefore, the minimum and maximum transition periods are set to be 1.5% and 4T, respectively, thereby achieving a high recording density. In addition, the clock signal can be easily extracted from the recorded signal. Furthermore, the present invention provides a simple conversion technique and a simple conversion circuit therefor.

Although the present invention has been shown and described with respect to a particular embodiment, various changes and modifications which are obvious to a person skilled in the art to which the invention pertains are deemed to lie within the spirit and scope of the invention.

For example, a combination of 2-bit data may be (0,0), (0,1) and (1,0). In this case, data (1,1) is used as the two upper bits of the resultant 3-bit data. Any other combination can also be utilized. In addition, the correspondence between the data word and the code word can be arbitrarily determined. It is only essential to obtain a one-to-one correspondence between the data word and the code word. A proper algorithm can be used in accordance with the selected correspondence.

What is claimed is:

1. A variable-length encoding method comprising the steps of:
   (a) receiving a binary digital data stream and framing the binary digital data string by using as a unit word any one of three 2-bit data and two 3-bit data in accordance with a state of said digital data string, said 2-bit data being three data words constituted by a first combination of three 2-bit data selected from a second combination of four 2-bit data (0,0), (0,1), (1,0) and (1,1), said 3-bit data being data words produced such that a remaining one of said second combination is used as upper bits of each of said 3-bit data and is combined with each of two 1-bit data as a lower bit of said 3-bit data;
   (b) sequentially receiving said data words, converting each one of the data words such that a given data word of said data words which is to be encoded is encoded to a corresponding one of 4-bit code words when the given data word corresponds to one of the 2-bit data, and the given data word is encoded to a corresponding one of 6-bit code words when the given data word corresponds to one of the 3-bit data, and producing a code word string;
   (c) further encoding a specific data array (1,0,1) to (0,0,1) when the specific data array is included in a code word of the code word string; and
   (d) producing a recording signal which has a pulse waveform subjected to alternate transition between first and second signal levels so as to correspond to positions of logic "1" data of an obtained data string of the code word string, and recording the recording signal on a recording medium.

2. The method according to claim 1, wherein the code words comprise:
   three 4-bit code words (0,1,0,0), (0,0,Y,0) and (1,0,0,0) respectively corresponding to the three 2-bit data words; and two 6-bit code words (0,0,0,1,0,0) and (1,0,0,1,0,0,) respectively corresponding to the two 3-bit data words, where a bit signal Y represents a bit value such that Y=0 when another code word following a code word including the bit signal Y has an MSB of logic "1" and Y=1 when the MSB is set to be logic "0".

3. The method according to claim 1, wherein the code words comprise:

three 4-bit code words (0,1,0,0), (0,0,1,0) and (1,0,0,0) respectively corresponding to the three 2-bit data words; and two 6-bit code words (0,0,0,1,0,0) and (1,0,0,1,0,0,) respectively corresponding to the two 3-bit data words.

4. The method according to claim 3, wherein an upper third bit of logic "1" of the code word (0,0,1,0) as one of the three 4-bit code words is further encoded to be logic "0" when the most significant bit of another code word following the code word (0,0,1,0) is set to be logic "1", whereby two "0"s are normally inserted between two nearest adjacent "1"s of the code word bit stream obtained by said encoding method.

5. The method according to claim 4, wherein an upper fourth bit of each of said code words is set to be normally "0" in the 4-bit code words and "1" in the 6-bit code words, whereby the upper fourth bit data is used as a marker bit to detect whether the given word corresponds to one of the 4 and 6-bit code words when the given word is decoded in a reproduction mode of the recording signal.

6. A variable-length encoding system comprising:

(a) data word generator means for receiving a binary digital data stream and for framing the binary digital data stream by using as a unit word a data word of variable length in accordance with a state of the data string, thereby generating a data word string, said data word of variable length being any one of three 2-bit data and two 3-bit data in accordance with the state of said digital data string, said 2-bit data being first three data words constituted by a first combination of three 2-bit data selected from a second combination of four 2-bit data (0,0), (0,1), (1,0) and (1,1), said 3-bit data being second data words produced such that a remaining one of said second combination is used as upper bits of each of said 3-bit data and is combined with each of two 1-bit data as a lower bit of said 3-bit data;

(b) first logic circuit means, connected to said data word generator means, for sequentially receiving the data words and performing a predetermined logic operation for converting each one of the data words such that a given data word of said data words which is subjected to encoding is encoded to a corresponding one of 4-bit code words when the given data word corresponds to one of the 2-bit data, and the given data word is encoded to a corresponding one of 6-bit code words when the given data word corresponds to one of the 3-bit data, and producing a code word string;

(c) second logic circuit means, connected to said first logic circuit means, for detecting a specific data array (1,0,1) included in the code words generated from said first logic circuit means and converting the specific data array to another data array; and (d) flip-flop circuit means, connected to said second logic circuit means, for producing a recording signal which has a waveform subjected to alternate transition between first and second signal levels in correspondence to positions of logic "1" data in a code word bit of stream and which is directly recorded on a predetermined magnetic recording medium.

7. The system according to claim 6, wherein said first logic circuit means converts a currently received data word of said data words to any one of the 4-bit code words (0,1,0,0), (0,0,1,0) and (1,0,0,0) in one-to-one correspondence when the currently received data word is one of the three 2-bit data.

8. The system according to claim 7, wherein said first logic circuit means converts a currently received data word of said data words to any one of the 6-bit code words (0,0,0,1,0,0) and (1,0,0,1,0,0) in one-to-one correspondence when the currently received data word is one of the two 3-bit data.

9. The system according to claim 8, wherein said second logic circuit means changes an upper third bit of the 4-bit code word (0,0,1,0) in accordance with a state of a code word generated next to the code word (0,0,1,0) when the 4-bit code word (0,0,1,0) is generated from said first logic circuit means.

10. The system according to claim 9, wherein said second logic circuit means comprises means for inverting the upper third bit of logic "1" of the 4-bit code word (0,0,1,0) to data of logic "0" when the code word next to the code word (0,0,1,0) has an MSB of logic "1".

* * * * *